(12) United States Patent
Huykman et al.

(10) Patent No.: US 6,417,646 B1
(45) Date of Patent: Jul. 9, 2002

(54) CIRCUIT FOR MONITORING CELLS OF A MULTI-CELL BATTERY DURING CHARGE

(75) Inventors: Richard B. Huykman, Montville; Harmohan Singh, Rockaway, both of NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/862,228

(22) Filed: May 22, 2001

(51) Int. Cl.[7] ............................................. H01M 10/40
(52) U.S. Cl. ................................................ 320/122
(58) Field of Search ................................ 320/116, 118, 320/119, 120, 122, 162

(56) References Cited

U.S. PATENT DOCUMENTS

| | | | | |
|---|---|---|---|---|
| 4,061,955 A | * | 12/1977 | Thomas et al. | 320/122 |
| 5,578,914 A | * | 11/1996 | Morita | 320/122 |
| 5,666,040 A | * | 9/1997 | Bourbeau | 320/122 X |

* cited by examiner

*Primary Examiner*—Edward H. Tso
(74) *Attorney, Agent, or Firm*—Loria B. Yeadon

(57) ABSTRACT

A circuit (M) to monitor and protect individual cells (12-1 ... 12-n) of a multi-cell battery (10) from over-charge and acquire data to be used to determine various characteristics of the cell state-of-health is connected to each individual cell (12) of a multi-cell battery as the battery is being charged. The circuit includes a portion (Q1–R5) to bypass charging current from the cell, this portion being variably pre-settable to bypass current above a desired high voltage (V-By) limit for the cell. As the battery is being charged, the bypass circuit will shunt current around a cell when the preset high voltage level is exceeded, thus preventing any damage to the cell. The circuit (Q2) can be operated to produce a pulse of current and the change in voltage of the monitored cell in response to the change in current, dV/dI, can be used to determine the cell internal resistance. The cell polarization resistance also can be determined. The data acquired can be used to determine factors relating to the cell state of charge (SOC) and its state of health. A programmable controller (C) controls all of the circuits and also acquires the data produced by the circuits.

19 Claims, 1 Drawing Sheet

CIRCUIT FOR MONITORING CELLS OF A MULTI-CELL BATTERY DURING CHARGE

GOVERNMENT STATEMENT

All or part of this invention was developed for Yardney and the US Air Force under Government Contract No. F33615-98-C-2898. The U.S. Government may have certain rights to this invention under terms of the contract.

FIELD OF THE INVENTION

The invention relates to a circuit for monitoring the voltage and current of individual cells of a multi-cell battery during charging and to bypass charging current in excess of a pre-set value that can be varied.

BACKGROUND OF THE INVENTION

Multi-cell, rechargeable batteries, such as those of the lithium ion type, are often used in mission control applications, such as uninterruptible power supplies and various military applications. The output voltage of such batteries depends on the numbers of cells connected in series and the particular chemistry selected for the cells. In some applications, a sufficient number of cells can be connected to achieve voltages as high as 400V.

As a multi-cell battery is being charged or recharged, a current source is connected across all of the series connected cells. As the charging takes place, individual cells might react differently to the charging current. In particular, it is desired that a cell not be overcharged since this would damage the cell and perhaps even the battery. Various circuits have been used to bypass excess current from reaching an individual cell during a charging cycle so that it will not be damaged. It is also desirable to monitor the state-of-health of each of the battery individual cells and the composite battery. This involves determining such parameters as the internal resistance, polarization resistance, and remaining capacity of each cell of the battery as a percentage of original capacity measured in ampere-hours, often called the state-of-charge (SOC).

BRIEF DESCRIPTION OF THE INVENTION

The present invention relates to a circuit that can monitor and protect individual cells of a multi-cell battery from over-charge and acquire data parameters to be used to determine various characteristics of the cell state-of-health.

The circuit in accordance with the invention is connected to each individual cell of a multi-cell battery to be monitored as the battery is being charged. The circuit includes a portion to bypass charging current from the cell, this portion being pre-settable in a variable manner to bypass current above a desired high voltage limit for the cell. As the battery is being charged, the bypass circuit will shunt current around a cell when the pre-set voltage level is exceeded, thus preventing any damage to the cell.

In another aspect of the invention, the circuit can be operated to produce a pulse of discharge current. When this is done the change in voltage of the monitored cell in response to the change in current, dV/dl, can be used to determine the cell internal resistance. The cell polarization resistance also can be determined by extending the discharge pulse. The data acquired can be used to determine factors relating to the state of charge (SOC) of a cell and its state of health.

OBJECTS OF THE INVENTION

An object of the invention is to provide a circuit to monitor all individual cells of a multi-cell battery during its operation.

An additional object is to provide a circuit to monitor an individual cell of a multi-cell battery during charging and to bypass charging current if a pre-set upper limit of the cell is exceeded during battery charging while permitting the charging of the other cells which have not reached the pre-set voltage limit.

Another object is to provide a monitoring circuit for individual cells of a multi-cell battery in which, as a cell is added to a battery pack, a monitoring circuit for the cell also is added in a modular fashion and interfaced to a controller in a modular fashion.

Yet another object is to provide a circuit to monitor individual cells of a multi-cell battery that can be operated to acquire data of a cell that is indicative of its state-of-health and state-of-charge.

Still a further object is to provide a monitoring circuit for each cell of a multi-cell battery that protects the cell against overcharge by bypassing current after the cell is charged to a pre-set upper voltage limit and that can be operated to acquire data to be used to determine the cell state-of-charge and state-of-health.

BRIEF DESCRIPTION OF THE DRAWINGS

Other objects and advantages of the present invention will become more apparent upon reference to the following specification and annexed drawing in which.

DETAILED DESCRIPTION OF THE INVENTION

Figure 1:
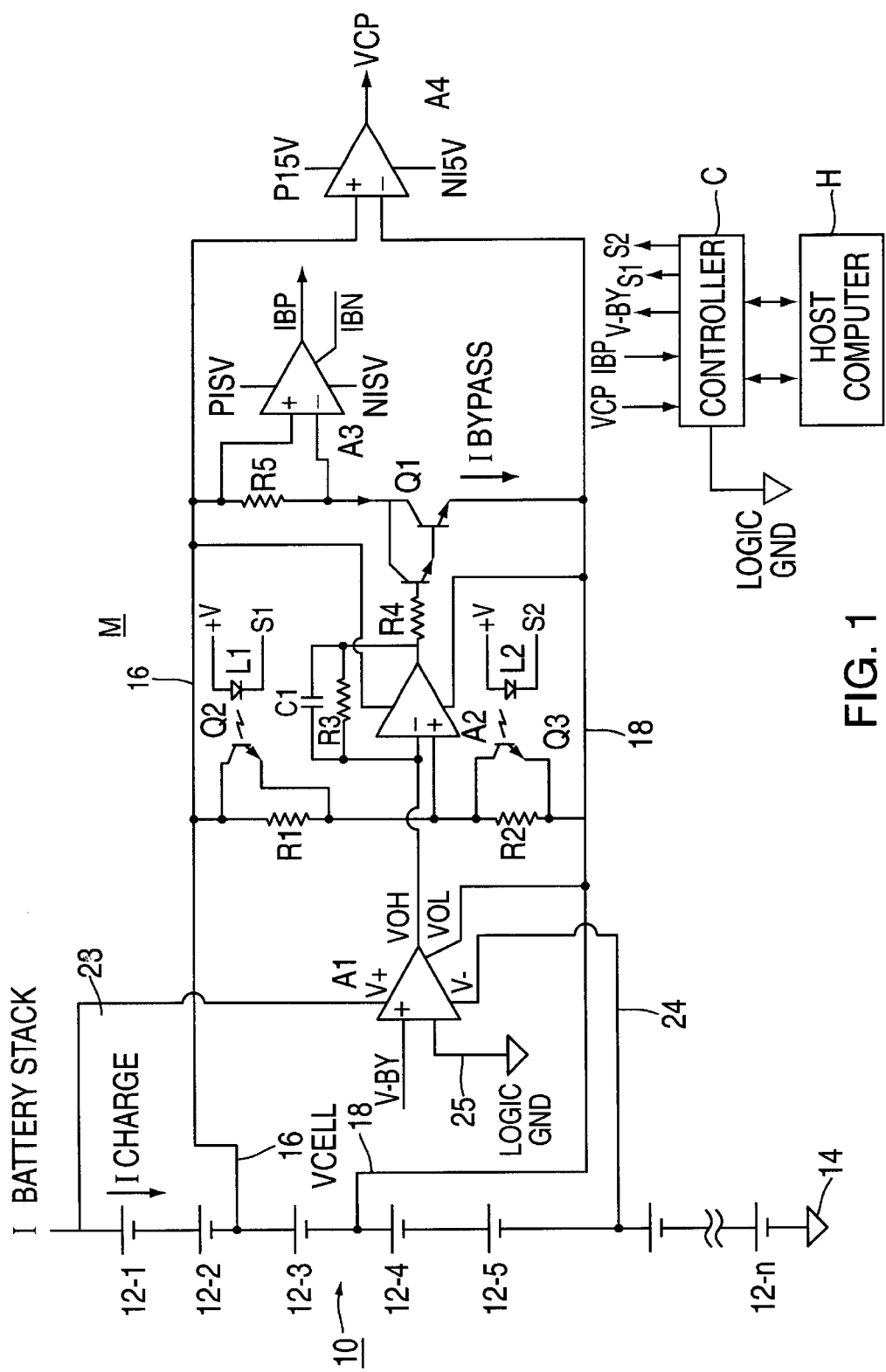
FIG. 1 is a schematic diagram of a circuit in accordance with the invention for monitoring a cell of a multi-cell battery as it is being charged and to bypass current in excess of a predetermined level.

Referring to FIG. 1, at the left side are shown the individual cells 1.2-1 . . . 12-n of a battery 10 of a battery pack. The cells 12 are connected in series between a current charging source 1, which can be external to the battery pack and can be for example a solar cell array, and a point of reference potential, such as ground 14. As many of the cells 12 are connected in series as needed to form the battery to have a desired output voltage.

The invention is illustratively described with respect to a lithium ion type battery. However, it is applicable to other types of rechargeable batteries, such as lead-acid and nickel-cadmium. In such batteries, cells are added in series to obtain a battery having a specified output voltage. For example: the average lithium cell voltage is 3.5V, so that eight cells connected in series make a 28V battery. A 28V battery may have a high value limit of 36V and a discharge voltage of 20V. Batteries, such as of the lithium ion type, require careful monitoring and control of the voltage of each of the cells to some upper voltage limit and some lower voltage limit. Thus, each individual cell 12 of the battery is to be monitored during charging to measure its voltage. Also, as described below, the state-of-charge and state-of-health of each cell also are to be determined.

In FIG. 1, the input leads 16 and 18 of a monitoring circuit M are illustratively shown connected to the terminals of the positive and negative electrodes of a cell, illustratively 12-3, of the battery. There is a separate monitoring circuit M for each cell and only one such circuit is described since each is the same. The cells 12 of the battery 10 and the circuits M preferably are packaged in a battery pack. If the battery pack is expanded with more cells, corresponding additional circuits M are provided. A cell monitoring circuit M is powered from the cells 12 themselves. The circuit M is designed to consume as little energy as possible to preserve the power of battery 10.

The operation of a circuit M is controlled by a controller illustratively shown by block C. The controller C can be a programmable or pre-programmed microprocessor and has analog outputs to and inputs from the circuit M as described below. Controller C is integrated into the battery pack with the monitoring circuits M. The controller C interfaces with each of the circuits M to set various operating points, monitor charge and discharge current, measure temperature, provide information to the external charger source, and control the battery pack switches to disconnect and protect against excessive charge or discharge. The controller C has a serial interface to communicate with a host computer, shown generally as H. The controller can have the necessary ADC and DAC converters to interface with the monitor circuit M. The controller C uses the ADC and DAC converters mostly to interface to the monitor circuit M. An analog output from a DAC also can be provided to control the battery charger current. Preferably, all communications outside the battery to the host computer H are done by the serial interface. It is also possible for the battery charger to use the serial interface instead of the DAC output.

In a typical application, the host computer relies on the battery and controls all system components utilizing the battery. The host computer is programmed with information such that it can do load shedding or make other decisions as to how best utilize the remaining stored energy in the battery 10. For example, the battery pack with controller C can be in a satellite and the charging current source I be solar cells. The host computer would be the primary on-board computer in charge of all the satellite resources. The host computer H may provide further data to the controller C to take advantage of various operating modes of the battery 10. In general, satellites and other space vehicles have their own central computer. The controller C in the battery is presumed to have the superior knowledge of the battery. It provides information to the host computer H of the satellite or other vehicle. In a typical application, for example, if the host computer specifies the remaining life of the mission and wants the most power while sacrificing the unneeded battery life, controller C will determine how to accomplish that goal. In a satellite application, the satellite ground control system typically would not control the battery operation. Such detailed operation would only occur under extreme emergency measures. Of course, the application could be one in which the battery pack is charged from a conventional power source on the ground and the host computer and controller are hard wired to each other.

The leads 16 and 18 across the cell 12-3 monitored by circuit M are connected to the upper and lower ends of a resistive divider formed by resistors R1 and R2. This divides the voltage of the monitored cell 12-3 down for an input from the junction of the two resistors to the non-inverting (+) input of an operational amplifier A2. Resistors R1 and R2 preferably are of high precision, such as 0.01%. At its power inputs, amplifier A2 obtains its negative rail voltage from the negative terminal of the cell being monitored over line 18 and its positive voltage from the positive terminal of the cell over line 16. The operational amplifier A2 preferably has high DC gain and low bandwidth. The input voltage range for amplifier A2 includes the negative supply reference for the amplifier. For a lithium-ion battery, the cell voltage range is from 2.5V to 4.5V, depending on the cell state of charge (SOC). The bandwidth of amplifier A2 is determined by the feedback signal provided between its output terminal and the amplifier inverted input (−) terminal by a network of a parallel connected resistor R3 and capacitor C1.

The operating voltages are chosen for amplifier A2 such that the amplifier will be disabled for voltages below a predetermined voltage from the monitored cell, this being about 3.5 volt in the lithium ion battery example being described. This minimizes current drain by amplifier A2. As described below, because of the feature of being able to disable amplifier A2, the bypass circuitry will not be turned ON accidentally at low voltages of the monitored cell. The bypass circuit is only needed to shunt current above a specified voltage range of the cell being monitored, for example, between 3.5V and 4.5V for the illustrative lithium-ion cell.

The output of A2 is connected through a resistor R4 to the base of a Darlington transistor Q1 which is configured as a common-emitter amplifier. The collector of Q1 is connected through a resistor R5 to the plus terminal of the monitored cell over line 16. Resistor R5 serves multiple purposes. First, R5 acts as a load to dissipates the bypassed current rather than requiring Q1 to dissipate all of the bypassed current. Second, as described below, R5 serves as a precision current shunt to measure the amount of the bypassed current. The value of R5 is selected so that the bypass current cannot exceed a safe upper limit. In a typical application, the safe upper limit of the bypass current is chosen as 0.1 C, (10% of the maximum charge current). The upper limit may change for different kinds of cells under different conditions. Also, the largest expected upper limit can be set by the value of R5 and the lower limits be controlled by the controller C program.

An amplifier A1 has a signal input V-By at its non-inverting input (+). Input V-By is a differential signal of variable predetermined magnitude from external control electronics in controller C that is referenced to the logic ground of the controller C electronics. The inverted (−) signal input of amplifier A1 is connected to the monitor circuit logic ground at point 25. Voltage V-By is set by the control electronics to specify the high voltage limit at which each of the cells 12 will be set. Amplifier A1 preferably is a high-common-mode, unity gain, precision difference amplifier and is powered from the cells 12. To provide the dynamic range required, amplifier A1 is powered at its power inputs over lines 23 and 24 from two cell voltages higher and two cell voltages lower than the cell it is monitoring. For a monitor circuit at the top cell of the stack, a voltage converter would be added to produce a boosted voltage since there are no cells left from which to obtain the higher voltage. For the first two cells near ground 14, the A1 amplifier has its negative power supply terminal connected to the minus voltage supply (NISV), such as 15 volts, of an external voltage source (not shown) since there are no two cell lower voltages at the bottom of the stack.

Amplifier A1 has a differential output whose negative reference VOL is connected to line 18, the minus terminal of the cell being monitored. The other output VOH of A1 is connected to the inverted (−) signal input of amplifier A2. Amplifier A1 converts the bypass set point voltage V-By from the controller C ground reference to the reference of the cell being monitored. This common-mode difference voltage can be as high as 400V in a lithium-ion battery.

Amplifier A2 compares the voltage of monitored cell 12-3, as scaled by divider R1-R2 and taken from the junction of divider R1-R2, applied at the non-inverting (+) input of A2 with the pre-set V-By high level set point voltage from amplifier A1 applied as VOH at the inverting input (−). If the V-By limit is exceeded by the measured cell voltage, then A2 produces a signal that turns on the Q1 bypass transistor. When transistor Q1 is turned ON, the cell charging current is bypassed around the monitored cell 12-3 over leads 16 and 18 through Q1 and through the current shunt resistor R5. The bypass current is designated I Bypass. This effectively makes a precision hard voltage limit on the voltage of the cell 12-3 being monitored.

It should be noted that V-By is adjustable and set from outside of circuit M through controller C. This can be done by the host computer. Thus, the set point is programmable and can be varied. A variable set point, for example, as set by the main computer of a satellite, allows choosing higher voltages for cells. While this will shorten battery life, it may be a reasonable tradeoff when the useful life of a mission will be achieved anyway.

As another example, charging of the battery 10 by solar cells for different satellite orbits may make it desirable to use different full charge limits to compensate for the dark time of solar cells when they cannot view the sun. The provision of the variable set point permits such tradeoffs to be dynamically controlled by the remote host computer.

The current bypass resistor R5 is a precision resistor that converts the bypassed current I Bypass to a voltage. The voltage at the maximum positive voltage end of R5 is applied to the non-inverted (+) input of an amplifier A3 and the lower voltage end of R5 is applied to the A3 inverted (−) input. Amplifier A3 preferably is a unity gain, high-common-mode, high-precision difference amplifier. Amplifier A3 runs from an external voltage source (not shown), for example, plus and minus 15 volts, referenced to the controller logic circuitry ground. The voltage output IBP of amplifier A3 is a measurement of the bypass current I Bypass. That is, amplifier A3 converts the I Bypass current measurement from the cell reference voltage level and references it to the controller C logic ground for use by the controller C and/or the host computer.

As indicated, the controller C sets the value of the charge current I. The battery 10 charge current I is at a value in terms of a voltage of a value that is known to the controller C. The controller electronics, for example its microcomputer, subtracts the current that is bypassed by Q1, represented by the A3 IBP output voltage, from the battery charge current I known to the controller to determine the net current that charges the monitored cell 12-3. The controller C operates to decrease the charge current I when I Bypass becomes greater than a specified amount as determined by a control algorithm for the battery cell chemistry. The control algorithm is programmed into the controller C.

As explained, the cell monitoring circuit M measures the cell voltage and any bypassed current during charge. If a cell is being overcharged, current is bypassed to keep the cell voltage from rising above a preset high voltage limit. Preferably, there is a charge control algorithm in the controller that tells the charger when to reduce the charge current so that it becomes unnecessary for the bypass circuit to waste a portion of the charge current. The specifics of the charge algorithm are not the subject of this application, which is directed to the interface circuitry to the battery pack.

An amplifier A4, which preferably is a high-common-mode, unity gain, precision gain difference amplifier, has its non-inverting (−) and inverting (+) inputs connected to the lines 16 and 18 of the cell 12-3 being monitored. Amplifier A4 also operates from the external voltage source (not shown), e.g. a plus (PISV) and minus (NISV) 15 volts, referenced to the controller C logic circuitry ground. Amplifier A4 preferably is a very stable and high precision, (0.02%) being achievable, amplifier. It converts the local cell 12-3 voltage to a ground referenced signal for measurement by the controller. The controller uses the output voltage of A4 to produce data used to determine various characteristics of the state-of-charge and state-of-health of the cell. Not shown is the temperature sensor for the cell. The state-of-charge is compensated for the temperature of the cell.

In general, the state-of-charge of a cell 12 is represented as a percentage of its full charge. Full charge occurs when the battery cell is at its upper voltage limit, 100% of full charge, i.e., 100% SOC. Full discharge, or 0% SOC occurs at the lower allowable voltage for a cell. If the cell voltage is half-way between these two voltage limits, it is at 50% SOC.

An opto-coupler Q2 is connected across R1 and an opto-coupler Q3 connected across R2. The conduction state of each of Q2 and Q3 is determined by control logic signals S1 and S2 from the controller C, which signals control respective LEDs L1 and L2. While opto-couplers are shown in the preferred embodiment of the invention, it should be understood that any other conventional type of switching arrangement can be used, for example, a transistor that is driven by a direct signal.

When opto-coupler Q2 is turned ON, preferably for a short time, by a pulse type signal S1 from the controller, the LED L1 is energized to emit light. In response to the light from L1, the opto-coupler Q2 conducts and shorts R1. This causes a positive going signal to be applied to the non-inverting (+) input of A2 that produces a signal at the output of A2 that turns on Q1 to its maximum allowed value for I bypass. The pulse of current from Q1 appears across R5 and is applied to A3 to produce a voltage pulse output of IBP from A3 that is applied to the controller C.

The pulse of current in R5 also causes a drop in the voltage of the monitored cell 12-3. This drop appears on lines 16 and 18, which are the inputs to amplifier A4. The output of A4 is the voltage VCP. The voltages at the outputs of A3 and A4 are applied to the controller C and used to determine the internal resistance of the cell. The cell internal resistance (IR) is determined by dV (output of A4) divided by dI (output of A3) in response to the Q1 current pulse Si. The controller C is programmed to compute IR or it sends the data to the host computer to do this.

The cell polarization resistance (PR) can be determined by extending the length of the current pulse, i.e., the duration of the light pulse from LED1. The current pulse is extended for a length of time such that the cell IR rises to a higher value. The current pulse is terminated after the cell internal resistance stabilizes at the new higher value of resistance. The final value of resistance minus the initial value of resistance determines the polarization resistance. Here also, the controller C is programmed to compute PR or it sends the data to the host computer to do this.

The controller C, through a corresponding monitor circuit M, can accumulate data on each cell 12 in a battery pack. As the cells go through numerous charge and discharge cycles, the change in the internal resistance of each cell and change in the number of ampere-hours delivered by the cell by each cell, from the upper charge voltage limit to the lowest permitted discharge voltage, are measured and characterized. This data can be used to compute various characteristics of a cell. For example, an increase in cell internal resistance and decrease in ampere-hours are used to provide remaining capacity of the cell with respect to original capacity as a percentage to specify its useful residual life expectancy in a system.

The opto-coupler Q3 is turned ON by logic control signal S2 to produce a pulse of light from L2 to cause Q3 to conduct and short out R2. This will hold Q1 in the off state and prevent current from being bypassed. This feature is used to determine the state-of-health of a cell.

The cell state-of-health is determined by different parameters that characterize its degradation from its original manufactured cell capacity. This determination can be made by determining a change in the current ampere-hour capacity from its original known value. In any given charge or discharge cycle, the controller C measures and computes an indication of the percentage of full charge that the cell is currently at. The algorithm for doing this is not part of the subject invention. It is sufficient to note that when the cell upper voltage limit is reached, the state-of-charge is 100%. When the cell is discharged to the lower permissible limit, the state-of-charge is 0%. By not equalizing the cell voltage with the current bypass; the divergence of the final state of charge of the cell allows determining its state of health. This provision can be used in the initial development of the algorithm. For example, an individual cell would be disabled from having the bypass circuitry equalize it during charge. By equalizing all but a particular cell during charging, the observed changes in cell parameters, such as the rate at which it accepts charge, can be used to characterize the efficiency of the equalization circuitry.

In addition to providing the percentage values, the controller can be programmed to provide estimated times to reach charge or discharge based upon the current passing through the battery cells. These factors give a real time view of the state-of-health and state-of-charge of a cell.

Specific features of the invention are shown in the drawing for convenience only, as each feature may be combined with other features in accordance with the invention. Alternative embodiments will be recognized by those skilled in the art and are intended to be included within the scope of the claims.

We claim:

1. A circuit to monitor a cell of a multi-cell battery that is being charged from a current source, comprising:
    means for variably setting a predetermined high limit voltage for the cell during its charging;
    a first amplifier connected to the cell for receiving as one input the voltage of the cell as the battery is being charged and said high limit voltage as another input, said first amplifier producing an output signal upon the cell voltage exceeding the high voltage limit; and
    a bypass circuit connected to the cell that is activated by receiving the output signal produced by said first amplifier to bypass the charging current around said cell.

2. A circuit as in claim 1 wherein said bypass circuit comprises a resistor through which the current bypassed flows, and further comprising:
    a second amplifier connected to said resistor to produce an output voltage corresponding to the magnitude of the bypass current.

3. A circuit as in claim 1 wherein said first amplifier further comprises a voltage divider connected across the cell and said one input to said first amplifier is taken from a point on said voltage divider.

4. A circuit as in claim 1 wherein said means for variably setting said predetermined high limit level voltage comprises a programmable controller.

5. A circuit as in claim 2 further comprising:
    switching means for operating said bypass circuit to produce a pulse of discharge current;
    a third amplifier connected across the cell to measure the cell voltage in response to the current pulse; and
    means receiving the output of said second amplifier and said third amplifier for determining the internal resistance of the cell as a function of the magnitude of the bypass current pulse and the cell voltage response.

6. A circuit as in claim 5 wherein said switching means operates to extend the current pulse for a time after the cell internal resistance is determined, said circuit further comprising means for using the outputs of said second amplifier and said third amplifier to determine the cell polarization resistance.

7. A circuit as in claim 5 further comprising:
    a controller for operating said switching means.

8. A circuit as in claim 7 wherein said switching means comprises:
    a light source operated by said controller to produce light of a duration corresponding to the duration of the current pulse, and an opto-coupler responsive to the light to produce a signal to operate said first amplifier to activate said bypass circuit.

9. A circuit as in claim 8 wherein said first amplifier further comprises a voltage divider connected across the cell and said one input to said first amplifier is taken from a point on said voltage divider, and wherein said opto-coupler is connected across a part of said voltage divider to operate said first amplifier to produce its output signal.

10. A circuit as in claim 5 further comprising second switching means connected to said first amplifier to prevent said first amplifier from producing its output signal for activating said current bypass circuit; and
    a controller for operating said second switching means.

11. A circuit as in claim 10 wherein said second switching means comprises:
    a light source operated by said controller to produce light; and
    an opto-coupler responsive to the light to produce a signal to operate said first amplifier to prevent said first amplifier means from producing its output signal.

12. A circuit as in claim 11 wherein said first amplifier further comprises a voltage divider connected across the cell and said one input to said first amplifier is taken from a point on said voltage divider, and wherein said opto-coupler is connected across a part of said voltage divider to operate said first amplifier to prevent production of its output signal.

13. A circuit to monitor an individual cell or a multi-cell battery, said multi-cells being serially connected to a current source, and said circuit comprising
    a first amplifier having power inputs connected to both terminals of the individual cell to be monitored, and
    a second amplifier having one power input connected to a cell serially above said individual cell and having a second power input connected to a cell serially below said individual cell to provide a dynamic operating range for said first amplifier, having a signal input for determining the high voltage limit for said individual cell, and having an output connected to a signal input of said first amplifier.

14. A circuit in accordance with claim 13 further comprising a bypass circuit connected across said individual cell, said bypass circuit including a resistor and a bypass switch connected to the output of said second amplifier.

15. A circuit in accordance with claim 14 further comprising a third amplifier connected across said resistor.

16. A circuit in accordance with claim 14 further comprising a voltage divider connected across said individual cell to be monitored, said first amplifier having a further signal input connected to a point on said voltage divider.

17. A circuit in accordance with claim 16 further comprising first and second switch means connected to said voltage divider for operating or preventing operation of said first amplifier.

18. A circuit in accordance with claim 17 wherein said first and second switch means each comprise an optocoupler connected across a portion of said voltage divider.

19. A circuit in accordance with claim 13 further comprising a network of a parallel connected resistor and capacitor connected between the output of said first amplifier and said signal input of said first amplifier to which the output of said second amplifier is connected.

* * * * *